US012660690B2

(12) United States Patent
Kong et al.

(10) Patent No.: US 12,660,690 B2
(45) Date of Patent: Jun. 16, 2026

(54) MICRO LED DISPLAY APPARATUS AND METHOD OF MANUFACTURING THE SAME

(71) Applicant: SAMSUNG ELECTRONICS CO., LTD., Suwon-si (KR)

(72) Inventors: Kiho Kong, Suwon-si (KR); Junghun Park, Yongin-si (KR); Eunsung Lee, Seoul (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 774 days.

(21) Appl. No.: 17/946,763

(22) Filed: Sep. 16, 2022

(65) Prior Publication Data

US 2023/0197693 A1     Jun. 22, 2023

(30) Foreign Application Priority Data

Dec. 17, 2021 (KR) ......................... 10-2021-0182016
Jan. 28, 2022 (KR) ......................... 10-2022-0013625

(51) Int. Cl.
*H10W 90/00* (2026.01)
*H10H 20/01* (2025.01)
(Continued)

(52) U.S. Cl.
CPC ............ *H10W 90/00* (2026.01); *H10H 20/01* (2025.01); *H10H 20/8312* (2025.01);
(Continued)

(58) Field of Classification Search
CPC ... H01L 25/0753; H01L 25/167; H10H 20/01; H10H 20/8312; H10H 20/8514;
(Continued)

(56) References Cited

U.S. PATENT DOCUMENTS

| | | | |
|---|---|---|---|
| 11,067,879 B2 | 7/2021 | Choy et al. | |
| 11,239,213 B2 * | 2/2022 | Zhang | ................... H10W 90/00 |

(Continued)

FOREIGN PATENT DOCUMENTS

| | | |
|---|---|---|
| CN | 111933653 A | 11/2020 |
| KR | 10-2020-0105843 A | 9/2020 |
| KR | 10-2021-0043236 A | 4/2021 |

OTHER PUBLICATIONS

Office Action issued Oct. 15, 2025 by the Korean Patent Office for KR Patent Application No. 10-2022-0013625.

*Primary Examiner* — Victor A Mandala
(74) *Attorney, Agent, or Firm* — Sughrue Mion, PLLC

(57) ABSTRACT

A micro light-emitting device display apparatus and a method of manufacturing the same are provided. The micro light-emitting device display apparatus includes a display unit including an array of a plurality of micro light-emitting devices, a driving unit backplane, and a bonding structure formed on coupling surfaces, facing each other, of the display unit and the driving unit backplane, and electrically connecting the display unit to the driving unit backplane. The bonding structure includes a plurality of bonding pads on one of the coupling surfaces of the display unit and driving unit backplane, and a dot pad array formed on the other coupling surface in a two-dimensional array to cover the plurality of bonding pads and an area therebetween.

14 Claims, 16 Drawing Sheets

(51) Int. Cl.
    *H10H 20/831*     (2025.01)
    *H10H 20/851*     (2025.01)
    *H10H 20/857*     (2025.01)

(52) U.S. Cl.
    CPC ...... *H10H 20/8514* (2025.01); *H10H 20/857*
        (2025.01); *H10H 20/032* (2025.01); *H10H*
        *20/0361* (2025.01); *H10H 20/0364* (2025.01)

(58) Field of Classification Search
    CPC .............. H10H 20/857; H10H 20/032; H10H
        20/0361; H10H 20/0364; H10H 20/018;
               H10H 20/819; H10H 20/831
    See application file for complete search history.

(56) References Cited

U.S. PATENT DOCUMENTS

| | | | |
|---|---|---|---|
| 2018/0308420 A1 | 10/2018 | Shin et al. | |
| 2020/0251638 A1* | 8/2020 | Morris ............... | G02B 27/0172 |
| 2020/0328197 A1* | 10/2020 | Han ........................ | H01L 24/13 |
| 2020/0373473 A1 | 11/2020 | Wi et al. | |
| 2021/0020688 A1* | 1/2021 | Templier ............. | H10H 29/142 |
| 2021/0111324 A1* | 4/2021 | Chung ................. | H10H 20/857 |
| 2021/0217804 A1* | 7/2021 | Takagi ................ | H10H 29/142 |
| 2022/0059740 A1* | 2/2022 | Hahn .................... | H10H 20/84 |
| 2022/0158057 A1* | 5/2022 | Song ................... | H10H 20/857 |
| 2023/0131918 A1* | 4/2023 | Tonkikh .............. | H10H 20/824 |
| | | | 257/13 |
| 2023/0163156 A1* | 5/2023 | Tan ...................... | H10H 29/142 |
| | | | 257/89 |

* cited by examiner

MICRO LED DISPLAY APPARATUS AND METHOD OF MANUFACTURING THE SAME

CROSS-REFERENCE TO RELATED APPLICATIONS

This application is based on and claims priority under 35 U.S.C. § 119 to Korean Patent Application No. 10-2021-0182016, filed on Dec. 17, 2021, in the Korean Intellectual Property Office, and Korean Patent Application No. 10-2022-0013625, filed on Jan. 28, 2022, in the Korean Intellectual Property Office, the disclosures of which are incorporated by reference herein in their entireties.

BACKGROUND

1. Field

Example embodiments of the disclosure relates to a micro light-emitting device display apparatus and a method of manufacturing the same.

2. Description of Related Art

Liquid crystal displays (LCD), organic light-emitting device (OLED) displays, and the like have been widely used as display apparatuses. Furthermore, recently, techniques for manufacturing high-resolution display devices using micro light-emitting devices (micro LEDs) have been in the spotlight. Light-emitting devices (LEDs) have advantages of low power consumption and eco-friendliness. Due to these advantages, an industrial demand for LEDs is increasing.

Micro LEDs are used not only for lighting devices or LCD backlights, but also as pixels of display devices. As such, a micro LED display apparatus employing a micro LED as a pixel includes a display unit including a micro LED and a driving unit backplane. The display unit and the driving unit backplane may be manufactured as a module through a bonding process after each is manufactured

SUMMARY

Provided are a micro light-emitting device display apparatus capable of lowering alignment difficulty of a bonding pad and a coupling surface processing level, and a method of manufacturing the same.

Additional aspects will be set forth in part in the description which follows and, in part, will be apparent from the description, or may be learned by practice of embodiments.

According to an aspect of an example embodiment, a micro light-emitting device display apparatus includes: a display unit including a plurality of micro light-emitting devices arranged in an array; a driving unit backplane including a plurality of driving devices configured to drive the display unit; and a bonding structure provided on a first coupling surface of the driving unit backplane and a second coupling surface of the display unit facing the first coupling surface, the bonding structure electrically connecting the plurality of micro light-emitting devices of the display unit to the plurality of driving devices of the driving unit backplane, wherein the bonding structure includes: a plurality of bonding pads spaced apart from each other on one of the first coupling surface and the second coupling surface; and a dot pad array provided on the other one of the first coupling surface and the second coupling surface, the dot pad array being arranged in a two-dimensional array to cover the plurality of bonding pads and an area between the plurality of bonding pads, so that a plurality of dot pads of the dot pad array corresponds to each bonding pad of the plurality of bonding pads.

The display unit may further include an isolation portion configured to pixelate the plurality of micro light-emitting devices.

The isolation portion may be formed by ion implantation.

The isolation portion may be formed down to the bonding structure to pixelate the plurality of micro light-emitting devices.

The display unit may further include a trench configured to pixelate the plurality of micro light-emitting devices.

Each of the plurality of micro light-emitting devices may include: a first semiconductor layer of a first conductive type adjacent to the bonding structure; an active layer on the first semiconductor layer; a second semiconductor layer of a second conductive type formed on the active layer, the second conductive type being opposite to the first conductive type; and an electrode electrically connected to the second semiconductor layer.

Each of the plurality of micro light-emitting devices may further include a first electrode between the first semiconductor layer and the plurality of dot pads.

The dot pad array may be provided on the second coupling surface, and the first electrode may form a stack structure with at least one dot pad of the dot pad array.

The first electrode includes a plurality of dot electrodes corresponding to the dot pad array and arranged in a two-dimensional array, and each dot pad of the dot pad array may form the stack structure with a corresponding dot electrode of the plurality of dot electrodes.

Each dot pad may have a size less than a size of each dot electrode.

The second semiconductor layer may be formed to have a roughened surface.

Each of the plurality of micro light-emitting devices is configured to generate blue light and, the micro light-emitting device display apparatus may further include a color conversion layer on at least some of the plurality of micro light-emitting devices.

According to an aspect of an example embodiment, a method of manufacturing a micro light-emitting device display apparatus, includes: preparing a driving unit backplane, the driving unit backplane including a plurality of driving devices and having a first coupling surface on which a plurality of bonding pads are formed apart from each other; preparing a display unit structure in which an epitaxial stack structure of a second semiconductor layer, an active layer, and a first semiconductor layer is formed on a growth substrate, and in which dot pads are formed on the first semiconductor layer in a two-dimensional array; forming a bonding structure by bonding the plurality of bonding pads of the driving unit backplane and the dot pads of the display unit structure to each other; exposing the second semiconductor layer by removing the growth substrate; and forming an array of a plurality of micro light-emitting devices of a display unit, by pixelating the epitaxial stack structure and forming an electrode electrically connected to the second semiconductor layer, wherein the dot pads are formed on a second coupling surface of the display unit structure and are configured to cover the plurality of bonding pads formed on the driving unit backplane and a region between the plurality of bonding pads so that a plurality of dot pads of the dot pads corresponds to each bonding pad of the plurality of bonding pads.

An isolation portion may be formed from a surface of the display unit structure to a level of the first semiconductor layer of the epitaxial stack structure to pixelate the epitaxial stack structure.

The isolation portion may be formed by ion implantation.

A trench may be formed from a surface of the display unit structure to a level of the first semiconductor layer of the epitaxial stack structure to pixelate the epitaxial stack structure.

Each of the plurality of micro light-emitting devices may include a first electrode between the first semiconductor layer and the dot pads, and at least one dot pad of the dot pads and the first electrode may form a stack structure.

The first electrode may include a plurality of dot electrodes corresponding to the dot pads and arranged in a two-dimensional array, and each dot pad of the dot pads may form the stack structure with a corresponding dot electrode of the plurality of dot electrodes.

Each dot pad may have a size less than a size of each dot electrode.

The preparing of the display unit structure may include: forming the epitaxial stack structure by sequentially stacking, on the growth substrate, the second semiconductor layer of a second conductive type, the active layer, and the first semiconductor layer of a first conductive type opposite to the second conductive type; forming, on the first semiconductor layer, the plurality of dot electrodes arranged in the two-dimensional array corresponding to the dot pads; depositing an insulating layer on the plurality of dot electrodes, and patterning the deposited insulating layer to expose the plurality of dot electrodes of the first electrode; forming a dot pad material layer on the patterned insulating layer to be connected to the exposed plurality of dot electrodes of the first electrode; and forming the two-dimensional array of the dot pads forming the stack structure with the plurality of dot electrodes of the first electrode by removing a partial height of the dot pad material layer and the insulating layer.

The method may further include thinning the second semiconductor layer by removing the exposed second semiconductor layer to a partial height.

An opening region may be formed in the electrode to expose the second semiconductor layer, the method may further include: forming a color conversion layer arranged in the opening region; and thinning the second semiconductor layer by removing the exposed second semiconductor layer to a partial height, the opening region exposes the thinned second semiconductor layer, and the forming of the color conversion layer may include: forming a plurality of partitions located in an area between the plurality of micro light-emitting devices; and forming the color conversion layer in a second opening region between the plurality of partitions.

An opening region may be formed in the electrode to expose the second semiconductor layer, the method may further include forming a color conversion layer arranged in a second opening region, the second semiconductor layer may be patterned to have a first surface forming the opening region and a partition protruding with respect to the first surface, the electrode may be formed on the partition of the second semiconductor layer, and the color conversion layer may be formed in the opening region formed by the first surface of the second semiconductor layer.

According to an aspect of an example embodiment, an electronic apparatus includes the micro light-emitting device display apparatus.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figures 1, 2:
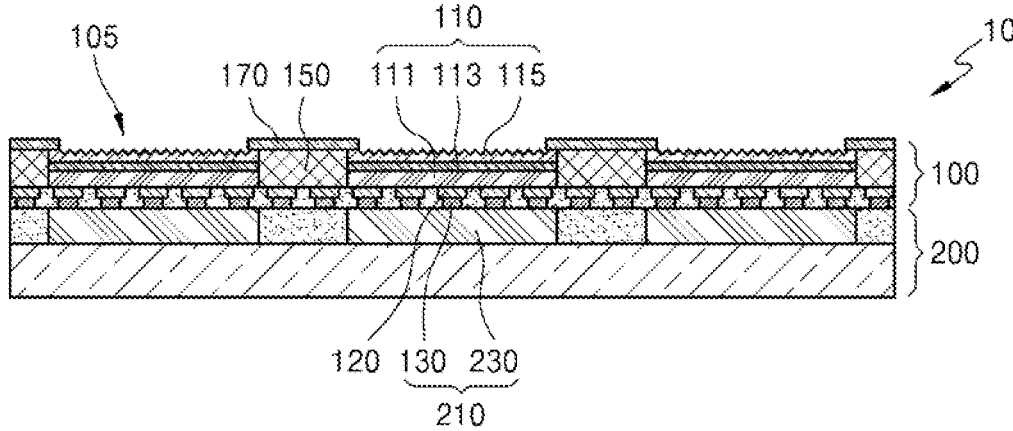
FIG. 1 is a schematic cross-sectional view of a micro light-emitting device display apparatus according to an example embodiment.
FIG. 2 schematically illustrates an example of a circuit diagram of the micro light-emitting device display apparatus of FIG. 1.

Example embodiments will now be described in detail with reference to the accompanying drawings, wherein like reference numerals refer to like elements throughout. In this regard, embodiments may have different forms and should not be construed as being limited to the descriptions set forth herein. As used herein, the term "and/or" includes any and all combinations of one or more of the associated listed items.

Throughout the drawings, like reference numerals denote like elements, and sizes of components in the drawings may be exaggerated for convenience of explanation and clarity. As embodiments described below are examples, other modifications may be produced from the embodiments.

Hereinafter, when a constituent element is disposed "above" or "on" to another constituent element, the constituent element may be only directly on the other constituent element or above the other constituent elements in a non-contact manner. The expression of singularity in the specification includes the expression of plurality unless clearly specified otherwise in context. Furthermore, it will be further understood that the terms "comprises" and/or "comprising" used herein specify the presence of stated features or components, but do not preclude the presence or addition of one or more other features or components.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as " . . . portion," " . . . unit," " . . . module," and " . . . block" stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure unless otherwise claimed.

Figure 3A:
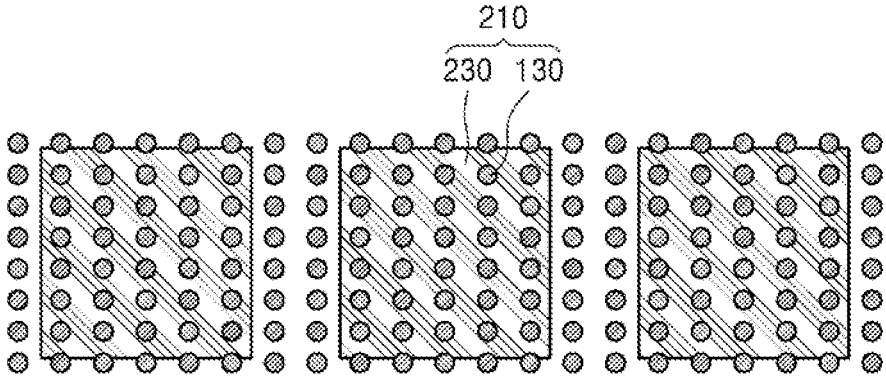
FIGS. 3A and 3B are plan views of example embodiments of a bonding structure of FIG. 1.
Figure 3B:
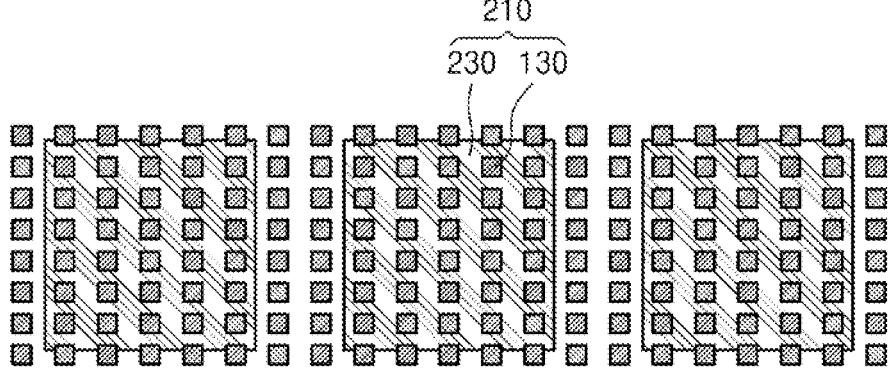

FIG. 1 is a schematic cross-sectional view of a micro light-emitting device display apparatus 10 according to an example embodiment. FIG. 2 schematically illustrates an example of a circuit diagram of the micro light-emitting device display apparatus 10 of FIG. 1, and FIGS. 3A and 3B are plan views of example embodiments of a bonding structure 210 of FIG. 1.

Referring to FIGS. 1, 2, and 3, the micro light-emitting device display apparatus 10 includes a display unit 100 including an array of a plurality of micro light-emitting devices 105, a driving unit backplane 200 including a plurality of driving devices, and a bonding structure 210 for electrically connecting the micro light-emitting devices 105 of the display unit 100 to the driving devices of the driving unit backplane 200.

The display unit 100 may include a two-dimensional array of the micro light-emitting devices 105. In the display unit 100, the micro light-emitting devices 105 may be provided in units of pixels or sub-pixels. For example, in the display unit 100, each of the micro light-emitting devices 105 may be provided in units of sub-pixels. In the following description, a case in which each of the micro light-emitting devices 105 is provided in units of sub-pixels in the display unit 100 is described as an example.

In the display unit 100, an isolation portion 150 may be formed to form the two-dimensional array of the micro light-emitting devices 105 by pixelating the micro light-emitting devices 105. The isolation portion 150 may be formed as a high resistance area by, for example, ion implantation. The isolation portion 150 may be formed in the form of trenches, as in an example embodiment described below. The isolation portion 150 may be formed from a surface of the display unit 100 to the location of a first semiconductor layer 111. The isolation portion 150 may electrically isolate the neighboring micro light-emitting devices 105 from each other.

The micro light-emitting devices 105 includes the first semiconductor layer 111 of a first conductive type adjacent to the bonding structure 210, an active layer 113 on the first semiconductor layer 111, a second semiconductor layer 115 of a second conductive type disposed on the active layer 113 and opposite to the first semiconductor layer 111, and a second electrode 170 electrically connected to the second semiconductor layer 115. The micro light-emitting devices 105 may further include a first electrode 120 below the first semiconductor layer 111. One of the first conductive type and the second conductive type may be an n-type, and the other may be a p-type. The first semiconductor layer 111, the active layer 113, and the second semiconductor layer 115 may form an epitaxial stack structure 110. In other words, each of the micro light-emitting devices 105 may include the epitaxial stack structure 110 of the first semiconductor layer 111, the active layer 113, and the second semiconductor layer 115, the first electrode 120 below the first semiconductor layer 111, and the second electrode 170 electrically connected to the second semiconductor layer 115. The surface of the second semiconductor layer 115 may be roughened to increase extraction efficiency. The second semiconductor layer 115 may have a roughened surface.

The first semiconductor layer 111 and the second semiconductor layer 115 may include, for example, group III-V or group II-VI compound semiconductors. The first semiconductor layer 111 and the second semiconductor layer 115 may serve to provide electrons and holes to the active layer 113. To this end, the first semiconductor layer 111 and the second semiconductor layer 115 may be doped in types that are electrically opposite to each other. For example, the first semiconductor layer 111 may be doped in an n-type and the second semiconductor layer 115 may be doped in a p-type, or the first semiconductor layer 111 may be doped in a p-type and the second semiconductor layer 115 may be doped in an n-type. For example, the first semiconductor layer 111 may include p-GaN, and the second semiconductor layer 115 may include n-GaN. In this case, the first electrode 120 formed below the first semiconductor layer 111 may correspond to an anode electrode, and the second electrode 170 electrically connected to the second semiconductor layer 115 may be a cathode electrode or a common electrode.

The active layer 113 may be an emission layer, and may have a quantum well structure in which a quantum well is disposed between barriers. The electrons and holes provided from the first semiconductor layer 111 and the second semiconductor layer 115 may be recombined in the quantum well of the active layer 113, so that light may be generated. The wavelength of light generated from the active layer 113 may be determined based on the energy bandgap of a material forming the quantum well of the light active layer 113. The active layer 113 may have only one quantum well, or a multi-quantum well (MQW) structure I which a plurality of quantum wells and a plurality of barriers are alternately arranged. The thickness of the active layer 113 or the number of quantum wells in the active layer 113 may be appropriately selected considering the driving voltage, the luminous efficiency, and the like of the micro light-emitting devices 105.

The active layer 113 may include, for example, a barrier layer and a quantum-well layer. For example, the barrier layer may include gallium nitride (GaN), and the quantum-well layer may include indium gallium nitride ($InxGa1-xN$ ($0 \leq x \leq 1$)). However, the disclosure is not limited thereto, and the barrier layer or the quantum-well layer may include various materials. The active layer 113 may have a structure in which the barrier layer and the quantum-well layer are alternately stacked N times, where N is a natural number equal to or greater than 1.

Each of the micro light-emitting devices 105 may have a size of about 0.1 to 1000 μm, about 0.1 to 200 μm, or about 100 μm or less. The size of each of the micro light-emitting devices 105 may mean, for example, the maximum length of distances between two points on the micro light-emitting devices 105. However, the size of each of the micro light-emitting devices 105 is not limited to the above ranges, and may be greater or less than the above ranges.

The micro light-emitting devices 105 may have, for example, the epitaxial stack structure 110 of the first semiconductor layer 111, the active layer 113, and the second semiconductor layer 115, which is capable of generating blue light. However, the disclosure is not limited thereto, and other semiconductor materials may be applied to the epitaxial stack structure 110 to generate light of a different wavelength band.

The driving unit backplane 200 may include a plurality of driving devices to drive the micro light-emitting devices 105 of the display unit 100 in units of pixels or sub-pixels, and may further include a plurality of switching devices. The driving unit backplane 200 may include, for example, a complementary metal oxide silicon (CMOS) backplane.

FIG. 2 shows an example of a pixel circuit provided in the driving unit backplane 200. The pixel circuit of FIG. 2 may drive the micro light-emitting devices 105, for example, in units of sub-pixels.

The driving device may apply a driving signal to the micro light-emitting devices 105 through the bonding structure 210. The driving device may include a transistor T1, a memory M1, and the like. The memory M1 may be static random access memory (SRAM), but the disclosure is not limited thereto, and other memory types may be employed.

Figure 4A:
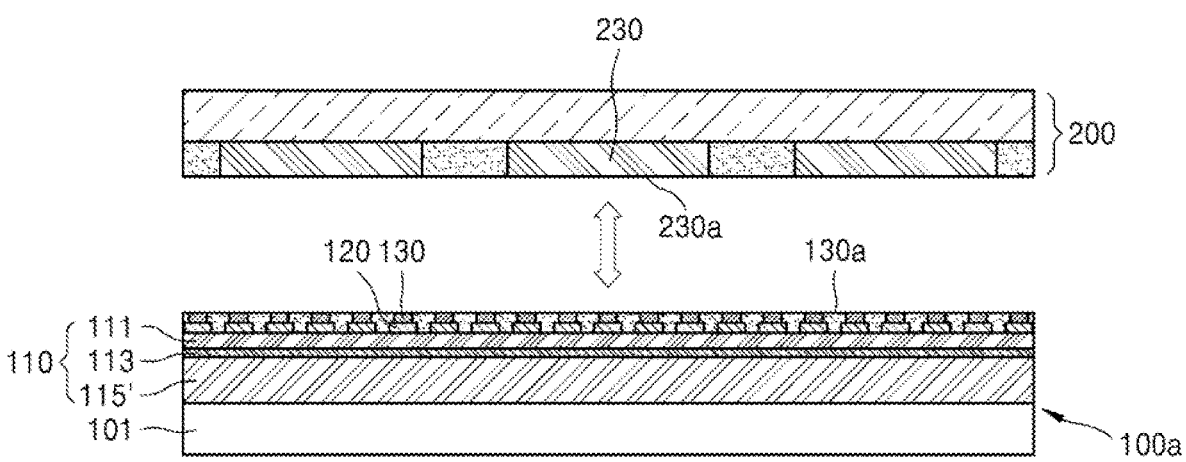
FIGS. 4A to 4F schematically illustrate a process of manufacturing a micro light-emitting device display apparatus, according to an example embodiment.

The micro light-emitting device display apparatus 10 according to an example embodiment may have a structure in which driving unit backplane 200 and the display unit 100 are coupled to each other by bonding a coupling surface 230*a* of the driving unit backplane 200 and a coupling surface 130*a* of a display unit structure 100*a* of FIG. 4A to manufacture the display unit 100 when the coupling surfaces 130*a* and 230*a* are located to face each other.

The bonding structure 210 may be provided on the two coupling surfaces 230*a* and 130*a* of the driving unit backplane 200 and the display unit 100. The bonding structure 210 may be provided to enable alignment-free bonding, as illustrated in FIGS. 3A and 3B. Referring to FIGS. 3A, 3B, and 4A, the bonding structure 210 may include a plurality of bonding pads 230 formed apart from each other on one coupling surface of the display unit 100 and the driving unit backplane 200, and a dot pad array 130 formed in a two-dimensional array to cover the bonding pads 230 and an area therebetween, on the other coupling surface of the display unit 100 and the driving unit backplane 200.

For example, the bonding pads 230 may be formed apart from each other on the coupling surface of the driving unit backplane 200. The dot pad array 130 may be formed in a two-dimensional array to cover the bonding pads 230 and the area therebetween, on the coupling surface of the display unit 100. The dot pad array 130 may be formed entirely on, for example, the coupling surface of the display unit 100.

Each dot pad 130 may be formed in various shapes as illustrated, for example, in FIGS. 3A and 3B. FIG. 3A illustrates an example that the dot pad 130 is circular, and FIG. 3B illustrates an example that the dot pad 130 is rectangular. This is merely an example, and the disclosure is not limited thereto. The dot pad 130 may be formed, for example, in various shapes, such as polygonal, oval, semi-circular, various shapes having a plurality of vertices, a shape partially composed of a curved surface, and the like, in addition to circular and rectangle.

In an example embodiment, the dot pad array 130 may be formed such that a plurality of dot pads 130 correspond to one of the bonding pads 230. As such, the size of the dot pad 130 and the interval between the dot pads 130 may be set to have each bonding pad 230 and the plurality of dot pads 130 correspond to each other.

As such, for example, when the bonding pads 230 are formed apart from each other on the coupling surface 230*a* of the driving unit backplane 200, the dot pad array 130 is formed entirely on the coupling surface 130*a* of the display unit 100 such that the plurality of dot pads 130 correspond to each bonding pad 230. As the display unit 100 and the driving unit backplane 200 are coupled to each other, the plurality of dot pads 130 are bonded to each bonding pad 230, so that alignment-free bonding is possible.

According to the micro light-emitting device display apparatus 10 according to an example embodiment, due to the bonding structure 210 in which one of the bonding pads 230 corresponds to the plurality of dot pads 130, when the display unit 100 and the driving unit backplane 200 are coupled to each other, alignment-free bonding is possible. Accordingly, the alignment difficulty of a bonding pad and a bonding surface processing level may be lowered, and thus, yield may be increased.

According to the micro light-emitting device display apparatus 10 according to an example embodiment, when the dot pad array 130 is formed on the coupling surface 130*a* of the display unit 100, and the first electrode 120 is further provided below the first semiconductor layer 111 (e.g., between the first semiconductor layer 111 and the dot pad array 130), the first electrode 120 may be provided to form a stack structure with at least one dot pad 130.

For example, as illustrated in FIG. 1, the first electrode 120 may be patterned to have a two-dimensional array of dot electrodes corresponding to the dot pad array 130, and thus, a stack structure of the dot electrodes of the first electrode 120 and the dot pad 130 may be formed. FIG. 1 shows an example in which the dot pad 130 is formed to have a size smaller than the dot electrode. In another example, the dot pad 130 may be formed to have a size equal to or greater than the dot electrode.

As such, according to the micro light-emitting device display apparatus 10 according to an example embodiment, as the bonding structure 210 is provided to be capable of alignment-free bonding, in a state in which the driving unit backplane 200 and the display unit structure 100*a* of FIG. 4A are located to have the respective coupling surfaces 130*a* and 230*a* face each other, the driving unit backplane 200 and the display unit 100 are coupled to each other by bonding the two coupling surfaces 130*a* and 230*a* to each other, a micro light-emitting device array manufacturing process including pixelation may be subsequently performed.

In this case, the subsequent pixelation and the micro light-emitting device array manufacturing process may be performed based on an alignment key existing on the driving unit backplane 200. In other words, the pixelation and electrode process may be performed on the epitaxial stack structure 110 based on the sub-pixels of the driving unit backplane 200 that has completed a process after the alignment-free bonding. Furthermore, for improvement of extraction efficiency, roughing of the second semiconductor layer 115 of the epitaxial stack structure 110 may be performed.

Accordingly, according to the micro light-emitting device display apparatus 10 according to an example embodiment, as the coupling of the driving unit backplane 200 and the display unit 100 is performed by the alignment-free bonding, a mesa structure and the like is not required for the pixelation process, and thus, mesa-free pixilation is possible.

FIGS. 4A to 4F schematically illustrate a process of manufacturing the micro light-emitting device display apparatus 10, according to an example embodiment.

To manufacture the micro light-emitting device display apparatus 10 according to an example embodiment, first, as illustrated in FIG. 4A, the driving unit backplane 200 and a display unit structure 100*a* are respectively manufactured and prepared.

The driving unit backplane 200 may include a plurality of driving devices to drive the micro light-emitting devices 105 of the display unit 100 in units of pixels or sub-pixels, and may further include a plurality of switching devices. The driving unit backplane 200 may include, for example, a complementary metal oxide silicon (CMOS) backplane. The driving unit backplane 200 may include, for example, the pixel circuit of FIG. 2 to drive the micro light-emitting devices 105 in units of sub-pixels, but the disclosure is not limited thereto. The pixel circuit configuration of the driving unit backplane 200 may be modified in various ways.

In the driving unit backplane 200, the bonding pads 230 may be formed on a first coupling surface 230*a*, for example, to be apart from each other. The bonding pads 230 may be arranged at the same period as the arrangement period of the micro light-emitting devices 105 of the display unit 100.

The display unit structure 100*a* a be formed by forming, on a growth substrate 101, the epitaxial stack structure 110 of a second semiconductor layer 115', the active layer 113, and the first semiconductor layer 111, forming, on the first semiconductor layer 111, the first electrode 120 to form a stack structure with at least one dot pad 130, and forming, on a second coupling surface 130*a* the dot pads 130 in a two-dimensional array. The display unit structure 100*a* may be prepared, for example, through the manufacturing process of FIGS. 5A to 5F.

FIGS. 5A to 5F exemplarily illustrate a process of forming the display unit structure 100*a* of FIG. 4A.

Figure 5A:
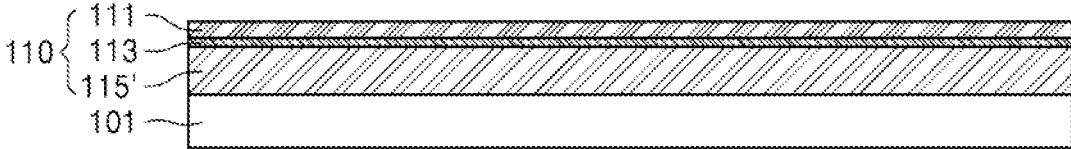
FIGS. 5A to 5F illustrate an example process of forming a display unit structure of FIG. 4A.

To form the display unit structure 100*a*, first, as illustrated in FIG. 5A, the epitaxial stack structure 110 may be formed by sequentially stacking, on the growth substrate 101, the second semiconductor layer 115' of a second conductive type, the active layer 113 and the first semiconductor layer 111 of a first conductive type that is the opposite type to the second conductive type. A silicon substrate, for example, may be used as the growth substrate 101. The second semiconductor layer 115' may be, for example, an n-GaN layer, and the first semiconductor layer 111 may be, for example, a p-GaN layer. In another example, the second semiconductor layer 115' may be a p-GaN layer, and the first semiconductor layer 111 may be an n-GaN layer Next, referring to FIG. 5B, a pattern of the first electrode 120 may be formed to form a two-dimensional array of dot electrodes on the first semiconductor layer 111, the two-dimensional array of dot electrodes corresponding to the dot pad array 130. The pattern of the first electrode 120 may be obtained, for example, by forming a layer of the first electrode 120 on the first semiconductor layer 111, and patterning the same to form a two-dimensional array of dot electrodes. In each of the micro light-emitting devices 105, the first electrode 120 may include a plurality of dot electrodes.

Figure 5B:
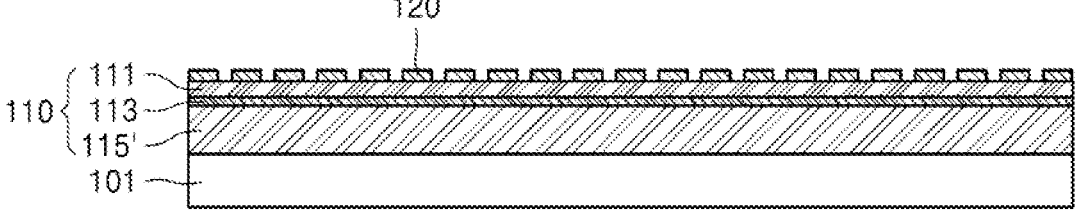
Figure 5C:
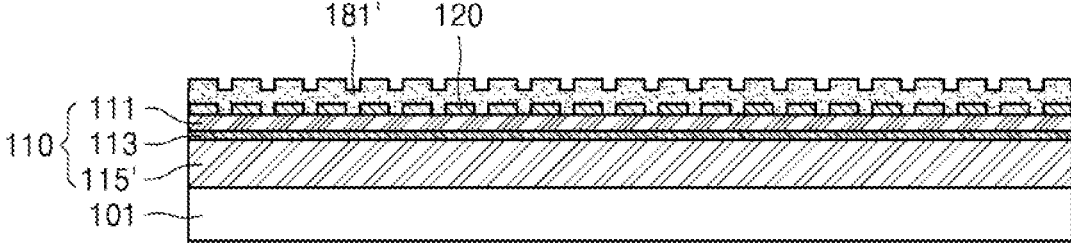
Figure 5D:
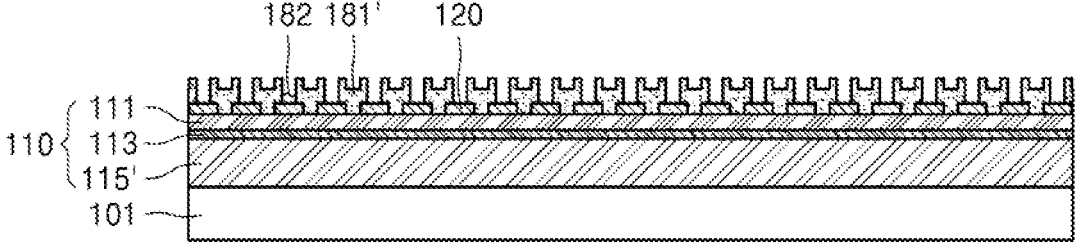

Next, referring to FIGS. 5C and 5D, an opening 182 may be formed by depositing an insulating layer 181' on the pattern of the first electrode 120, and patterning the deposited insulating layer 181' to expose each dot electrode of the first electrode 120. The insulating layer 181' may include, for example, an insulating material such as SiO2, but the disclosure is not limited thereto.

Figure 5E:
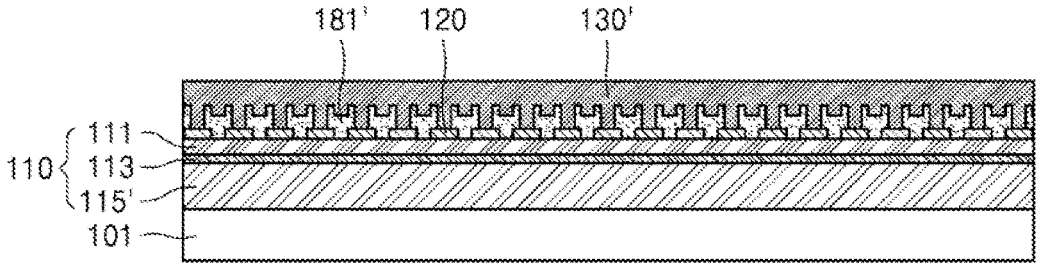

Next, referring to FIG. 5E, a dot pad material layer 130' may be formed on the patterned insulating layer 181'. In this state, the dot pad material layer 130' may be formed to have a sufficient thickness to cover the patterned insulating layer 181'. Accordingly, as a dot pad material fills the openings 182 of the insulating layer 181', the dot pad material layer 130' may be electrically connected to the each dot electrode of the first electrode 120 that is exposed through opening 182. The dot pad material layer 130' may be formed by plating the patterned insulating layer 181' with, for example, copper (Cu).

Figure 5F:
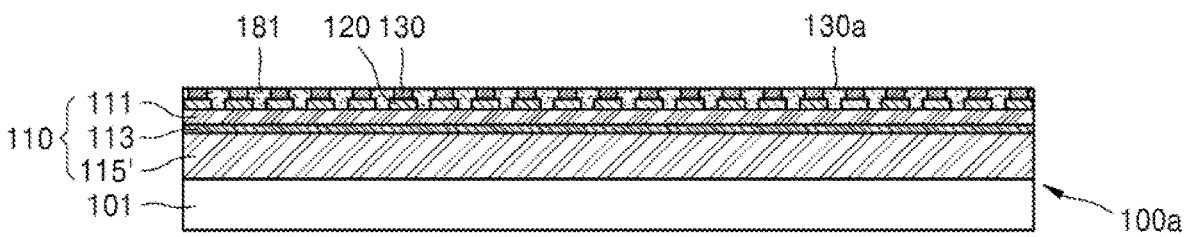

Next, by removing a partial thickness of the dot pad material layer 130' and the insulating layer 181', as illustrated in FIG. 5F, the display unit structure 100*a* in which the two-dimensional array of the dot pad 130 forming the stack structure with each dot electrode of the first electrode 120 is formed on the second coupling surface 130*a* may be formed. In FIG. 5F, a reference numeral 181 corresponds to an insulating layer that electrically insulates the first electrode 120 between adjacent micro light-emitting devices 105 or between adjacent stack structures of the dot pad 130 and each dot electrode of the first electrode 120 left behind by removing the partial thickness of the patterned insulating layer 181'.

An example in which the first electrode 120 is provided in the form of a dot electrode to including a plurality of dot electrodes with respect to one micro light-emitting device 105 is described above with reference to FIGS. 5B to 5F, but the disclosure is not limited thereto. The first electrode 120 may not be provided in the form of a dot electrode.

As such, the dot pads 130 cover the bonding pads 230 formed on the driving unit backplane 200 and an area therebetween, and the dot pads 130 may be formed on the second coupling surface 130*a* of the display unit structure 100*a* such that each bonding pad 230 and the plurality of dot pads 130 correspond to each other. Furthermore, to have the first electrode 120 and at least one dot pad 130 form a stack structure, the first electrode 120 may be provided, for example, in a two-dimensional array of dot electrodes to correspond to the dot pad array 130, so that a stack structure of the dot pad 130 and the dot electrode may be formed. The dot pad 130 may be formed in a size smaller than the dot electrode. In another example, the dot pad 130 may be formed to have a size equal to or greater than the dot electrode.

FIG. 1, and FIGS. 4A to 4F, and another example embodiment to be described later, show examples in which the first electrode 120 is patterned to form the stack structure of the dot pad 130 and the dot electrode, but the first electrode 120 may not be formed to include a plurality of dot electrodes with respect to each of the micro light-emitting devices 105. In other words, the first electrode 120 may be formed to include a single electrode for each micro light-emitting device 105. In this case, the first electrode 120 may be in contact with the plurality of dot pads 130 with respect to each micro light-emitting device 105. In another example, instead of the stack structure of the first electrode 120 and the dot pad 130, as a structure without the first electrode 120, the dot pad 130 may be provided to serve as the first electrode of the micro light-emitting device 105.

When the first electrode 120 is not formed as a dot electrode, in the process of FIG. 5B, the pattern of the first electrode 120 may be formed such that the first electrode continuously exists in a region corresponding to each micro light-emitting devices 105. In this case, to form the stack structure of the dot pad 130 and the first electrode 120 in the form that the plurality of dot pads 130 are electrically connected to the first electrode 120 in a region corresponding to one micro light-emitting device 105, in the processes of FIGS. 5C and 5D, the insulating layer 181' is patterned to expose the first electrode 120 at a plurality of positions, and then the processes of FIGS. 5E and 5F may be performed. Accordingly, a structure in which the plurality of dot pads 130 are stacked with respect to the first electrode 120 may be obtained.

Referring back to FIG. 4A, the display unit structure 100*a* that has been prepared through the manufacturing processes described with reference to FIGS. 5A to 5F is located such that the second coupling surface 130*a* faces the first coupling surface 230*a* of the driving unit backplane 200.

Figure 4B:
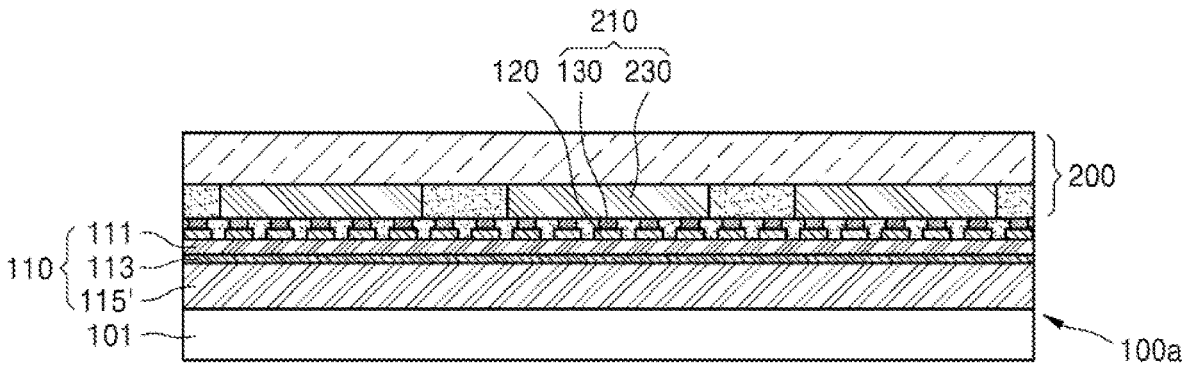

Next, as illustrated in FIG. 4B, when the first coupling surface 230*a* of the driving unit backplane 200 and the second coupling surface 130*a* of the display unit structure 100*a* are bonded to each other, the bonding structure 210 in which the plurality of dot pads 130 correspond to each bonding pad 230 is formed, and thus, the driving unit backplane 200 and the display unit structure 100*a* are coupled to each other.

Figure 4C:
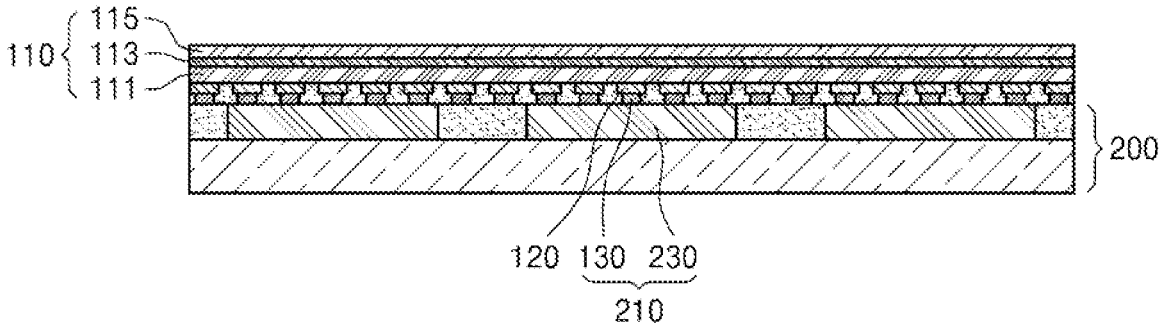

Next, as illustrated in FIG. 4C, with the driving unit backplane 200 positioned below, the growth substrate 101 may be removed to expose the second semiconductor layer 115', and the exposed second semiconductor layer 115' may be removed to a partial height to have a thickness suitable for the micro light-emitting device 105 so that the second semiconductor layer 115 that is thinned may be formed. FIG. 4C shows an example of thinning the semiconductor layer 115' by removing the exposed second semiconductor layer 115' to a partial height as a whole. The thinning of removing a partial height of the second semiconductor layer 115' may be performed by, for example, a chemical mechanical planarization (CMP) process and the like.

As in another example embodiment being described later, only a portion of the second semiconductor layer 115' being formed as a color change layer may be optionally thinned, and in this case, an unremoved thick portion of the second semiconductor layer 115' may be used as a partition for forming the color change layer.

Figure 4D:
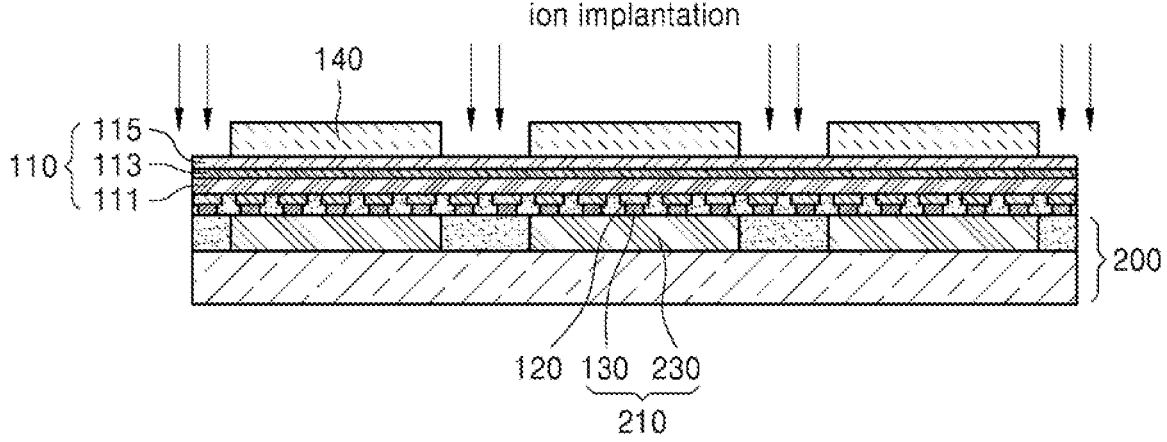
Figure 4E:
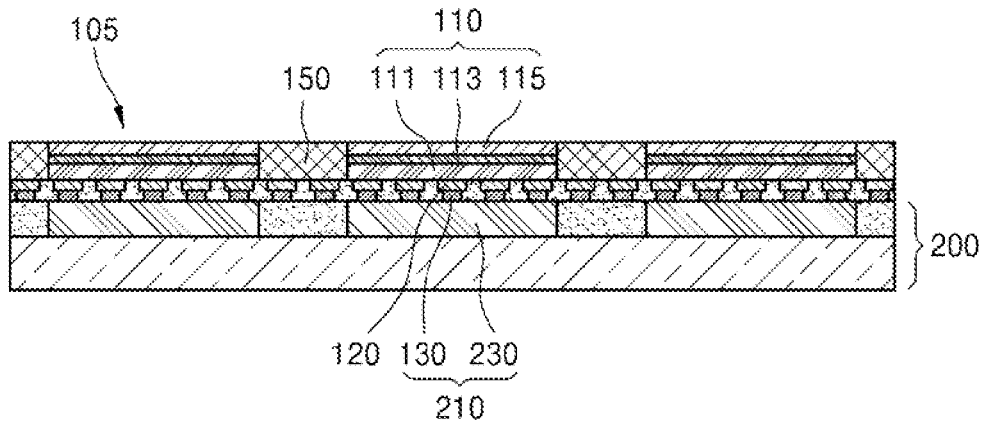

Next, as illustrated in FIGS. 4D and 4E, the epitaxial stack structure 110 of the first semiconductor layer 111, the active layer 113, and the second semiconductor layer 115 may be pixelated to form the micro light-emitting device array on the display unit 100. To pixelate the epitaxial stack structure 110, the isolation portion 150 may be formed from a surface of the to the first semiconductor layer 111 of the epitaxial stack structure 110. To form the isolation portion 150, as illustrated in FIG. 4D, a mask pattern 140, is formed on the epitaxial stack structure 110, that is, the thinned second semiconductor layer 115, and ion implantation may be performed through an opening of the mask pattern 140. As a high resistance region is formed to the level of the first semiconductor layer 111 by the ion implantation, as illustrated in FIG. 4E, the isolation portion 150 to pixelate the epitaxial stack structure 110 may be formed. A region between the isolation portions 150 of the epitaxial stack structure 110 corresponds to the micro light-emitting device 105, and the micro light-emitting devices 105 may be electrically separated by the isolation portion 150. Instead of forming a high resistance region by the ion implantation and the like, for example, a trench is formed to the level of the first semiconductor layer 111, and an insulating material layer is selectively formed in the trench to form the isolation portion 150 to pixelate the epitaxial stack structure 110.

Figure 4F:
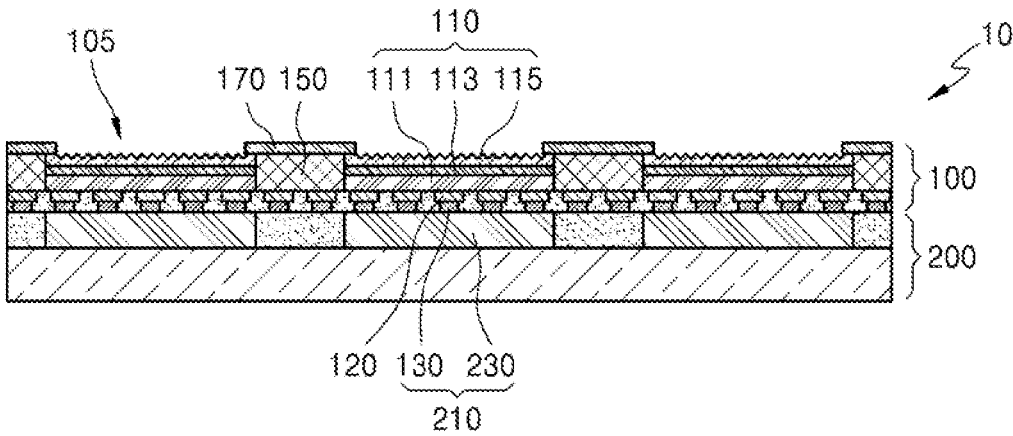

Next, referring to FIG. 4F, by forming the second electrode 170 electrically connected to the second semiconductor layer 115 to form an array of a plurality of micro light-emitting devices 105 of the display unit 100, the micro light-emitting device display apparatus 10 may be manufactured in a structure in which the display unit 100 is bonded to the driving unit backplane 200.

The second electrode 170 may be provided to be electrically connected to the second semiconductor layer 115, while forming, for example, an opening region exposing the second semiconductor layer 115. As illustrated in FIGS. 1, 4E, and 4F, when the isolation portion 150 is formed between the micro light-emitting devices 105, the second electrode 170 may extend on the isolation portion 150 to the second semiconductor layer 115, and thus may be formed to be electrically connected to the second semiconductor layer 115 while forming the opening region exposing the second semiconductor layer 115.

The surface of the second semiconductor layer 115 may be roughened to increase extraction efficiency. The process of roughening the surface of the second semiconductor layer 115 may be omitted. FIGS. 1 and 4F show an example in which the surface of the second semiconductor layer 115 is roughened.

Figure 6:
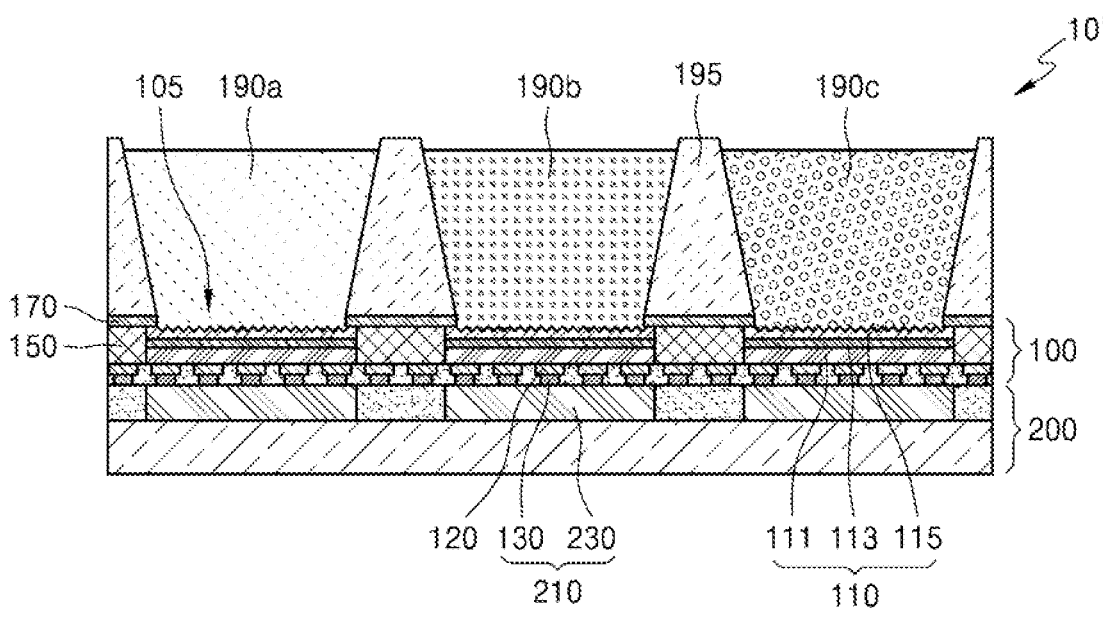
FIG. 6 is a schematic cross-sectional view of a micro light-emitting device display apparatus according to an example embodiment.

FIG. 6 is a schematic cross-sectional view of a micro light-emitting device display apparatus 10' according to another example embodiment. Compared with the micro light-emitting device display apparatus 10 of FIG. 1, the micro light-emitting device display apparatus 10' further includes color conversion layers 190*a*, 190*b*, and 190*c* on the micro light-emitting devices 105.

Referring to FIG. 6, for implementation of a full color of the micro light-emitting device display apparatus 10' according to an example embodiment, the color conversion layers 190*a*, 190*b*, and 190*c* forming one pixel may include, for example, a first color conversion layer 190*a* for converting the light emitted by the micro light-emitting device 105 to first color light, a second color conversion layer 190*b* for converting the light emitted by the micro light-emitting device 105 to second color light, and a third color conversion layer 190*c* for converting the light emitted by the micro light-emitting device 105 to third color light. For example, the first color light may be red light, the second color light may be green light, and the third color light may be blue light. When the micro light-emitting device 105 is provided to emit blue light, the first color conversion layer 190*a* may be provided to convert the blue light to red light, the second color conversion layer 190*b* may be provided to convert the blue light to green light, and the third color conversion layer 190*c* may be provided to convert the blue light generated from the micro light-emitting device 105 into blue light having a narrower bandwidth. A transparent layer for transmitting blue light may be provided instead of the third color conversion layer 190*c*. The number, arrangement, and the like of the color conversion layers 190*a*, 190*b*, and 190*c* forming one pixel may be changed according to a full color implementation method.

A partition 195 may be disposed between the respective color conversion layers 190*a*, 190*b*, and 190*c*. For example, the partition 195 may be formed in a region between the micro light-emitting devices 105, that is, on the second electrode 170 formed on the isolation portion 150, and the color conversion layers 190*a*, 190*b*, and 190*c* may be formed within an opening region between the partitions 195.

Figure 7:
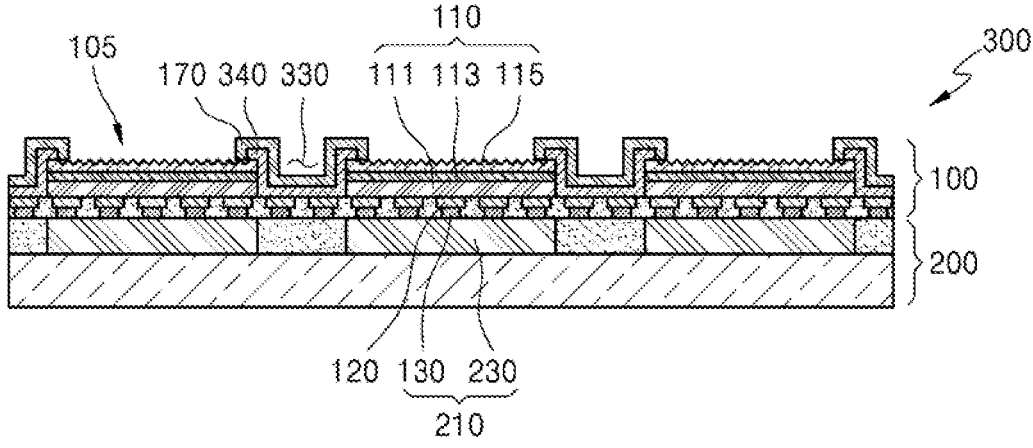
FIG. 7 is a schematic cross-sectional view of a micro light-emitting device display apparatus according to an example embodiment.

FIG. 7 is a schematic cross-sectional view of a micro light-emitting device display apparatus 300 according to another example embodiment. Compared with the micro light-emitting device display apparatus 10 of FIG. 1, the micro light-emitting device display apparatus 300 has a difference in that an isolation portion 330 is formed as a trench, not as the high resistance region.

Referring to FIG. 7, to form the two-dimensional array of the micro light-emitting devices 105 in the display unit 100 by pixelating the micro light-emitting devices 105, a trench may be formed, as the isolation portion 330, from a surface of the display unit 100 to the level of, for example, the first semiconductor layer 111. The trench may electrically isolate the neighboring micro light-emitting devices 105 from each other.

In an example embodiment, an insulating layer 340 may be formed in the trench, and the second electrode 170 may be formed on the insulating layer 340 to extend to the second semiconductor layer 115 of the epitaxial stack structure 110.

FIGS. 8A to 8G schematically illustrate a process of manufacturing a micro light-emitting device display apparatus 300, according to an example embodiment.

Figure 8A:
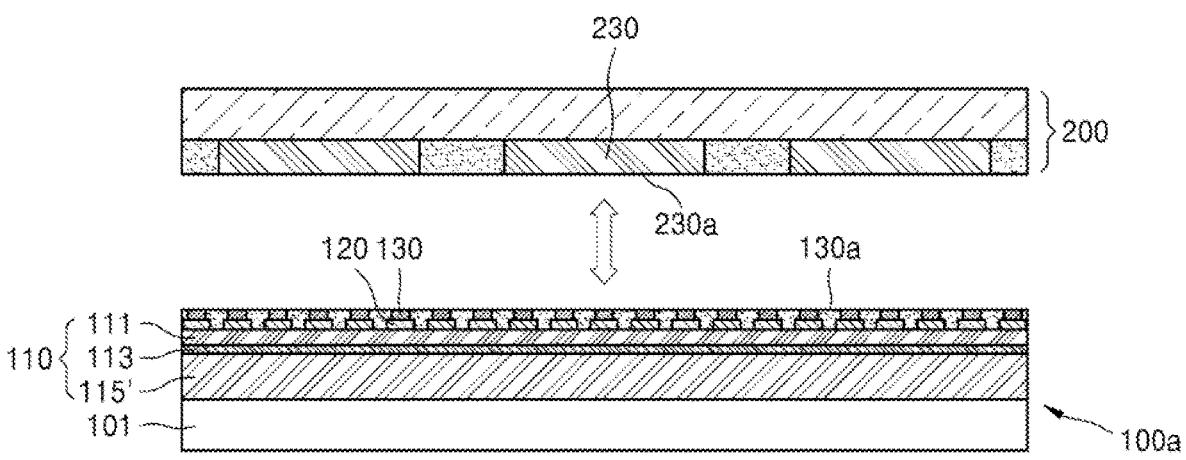
FIGS. 8A to 8G schematically illustrate a process of manufacturing a micro light-emitting device display apparatus, according to an example embodiment.
Figure 8B:
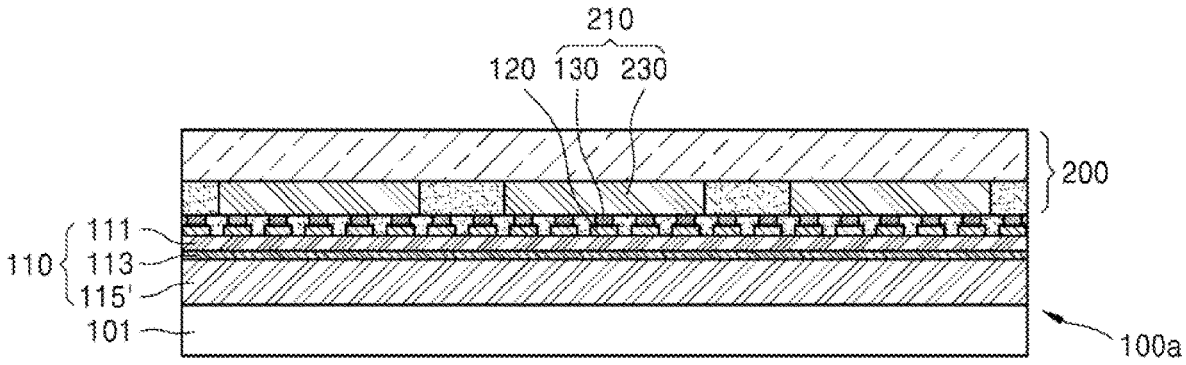
Figure 8C:
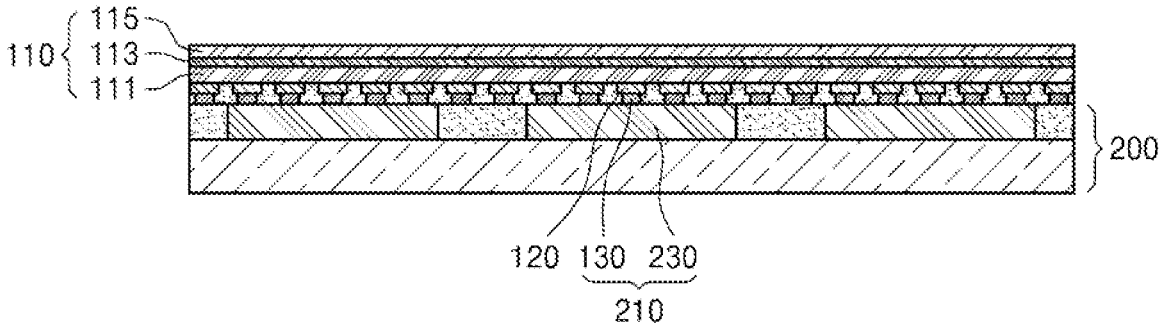

The process of FIGS. 8A to 8C for manufacturing the micro light-emitting device display apparatus 300 according to an example embodiment is the same as described above with reference to FIGS. 4A to 4C and FIGS. 5A to 5F. In other words, the driving unit backplane 200 and the display unit structure 100a are respectively manufactured and prepared, and the prepared driving unit backplane 200 and display unit structure 100a are positioned such that the first coupling surface 230a of the driving unit backplane 200 and the second coupling surface 130a of the display unit structure 100a face each other. Then, the driving unit backplane 200 and the display unit structure 100a are coupled to each other by bonding the first coupling surface 230a of the driving unit backplane 200 and the second coupling surface 130a of the display unit structure 100a to each other to form the bonding structure 210 in which the plurality of dot pads 130 correspond to each bonding pad 230. In a state in which the driving unit backplane 200 is positioned below as shown, e.g., in FIG. 8C, the second semiconductor layer 115' is exposed by removing the growth substrate 101, and the second semiconductor layer 115 that is thinned is formed by removing the exposed second semiconductor layer 115' to a partial height to have a thickness suitable for the micro light-emitting devices 105.

Figure 8D:
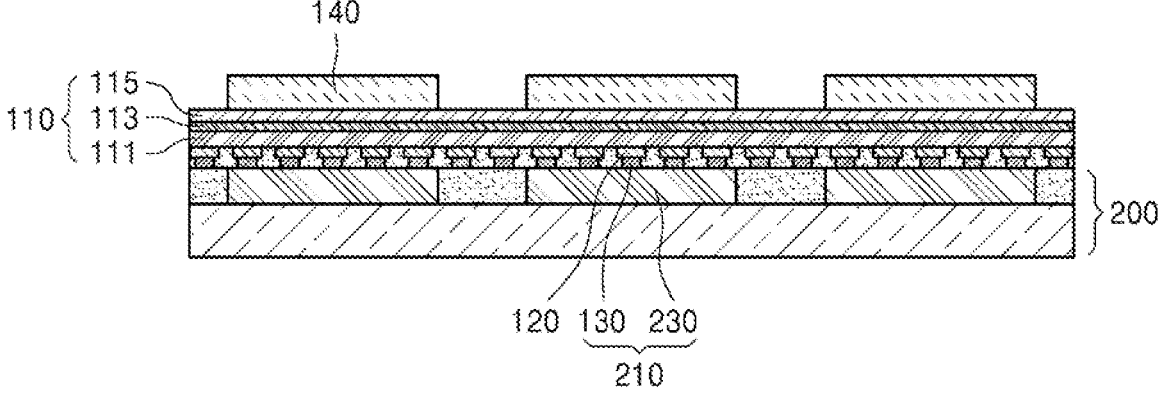
Figure 8E:
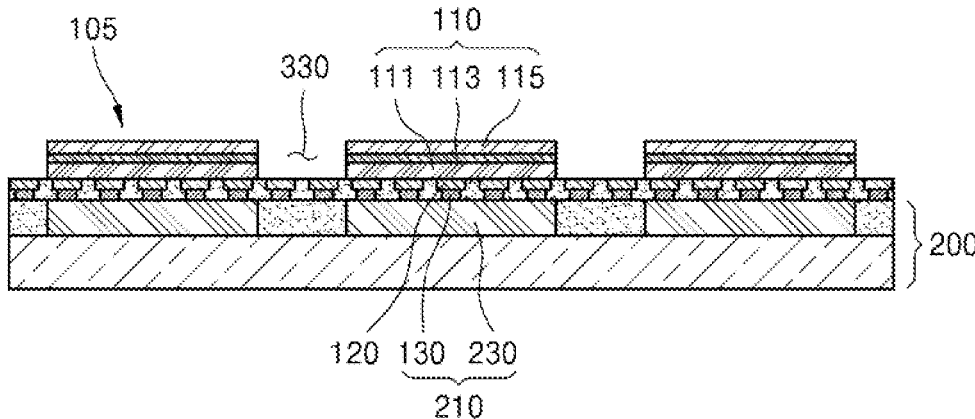

Next, as illustrated in FIGS. 8D and 8E, to form the micro light-emitting device array in the display unit 100, the epitaxial stack structure 110 of the first semiconductor layer 111, the active layer 113, and the second semiconductor layer 115 may be pixelated. To pixelate the epitaxial stack structure 110, the isolation portion 330, for example, a trench, may be formed to the level of the first semiconductor layer 111 of the epitaxial stack structure 110. As illustrated in FIG. 8D, the mask pattern 140 may be formed on the epitaxial stack structure 110, that is, the thinned second semiconductor layer 115, and the trench may be formed by performing etching to the level of the first semiconductor layer 111 of the epitaxial stack structure 110 through an opening of the mask pattern 140. The trench may electrically isolate the neighboring micro light-emitting devices 105 from each other.

Figure 8F:
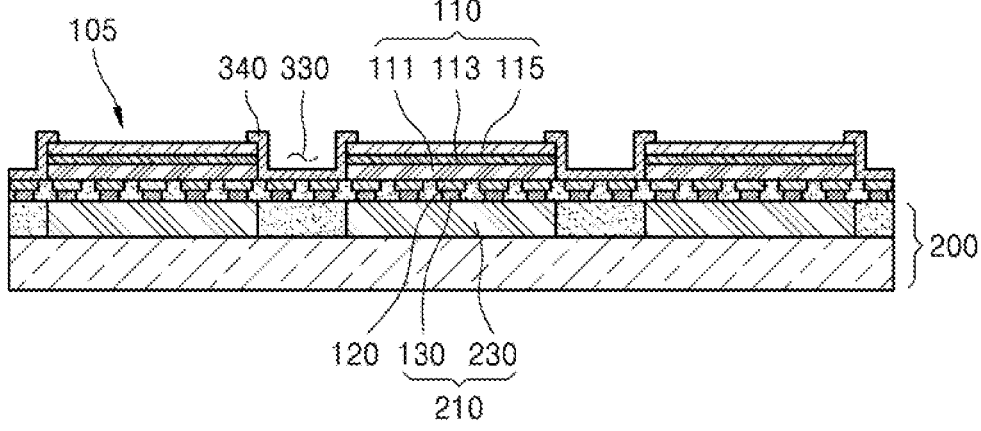
Figure 8G:
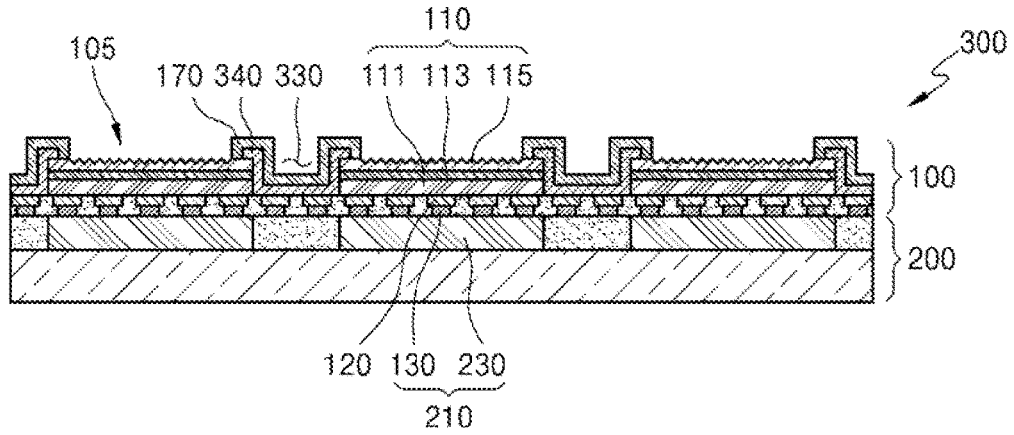

Next, as illustrated in FIGS. 8F and 8G, the insulating layer 340 may be formed in the trench, and the second electrode 170 may be formed on the insulating layer 340 to extend to the second semiconductor layer 115 of the epitaxial stack structure 110. The second electrode 170 may be electrically connected to the second semiconductor layer 115, while forming, for example, the opening region for exposing the second semiconductor layer 115. As such, by forming the micro light-emitting device array of the display unit 100, the micro light-emitting device display apparatus 300 having a structure in which the display unit 100 is bonded to the driving unit backplane 200 may be manufactured.

The surface of the second semiconductor layer 115 may be roughened to increase extraction efficiency. The process of roughening the surface of the second semiconductor layer 115 may be omitted. FIGS. 7 and 8G show an example in which the surface of the second semiconductor layer 115 is roughened.

The micro light-emitting device display apparatus 300 according to an example embodiment described with reference to FIG. 7 and FIGS. 8A to 8G may further include a color conversion layer on the micro light-emitting devices 105 for full color implementation. As in the micro light-emitting device display apparatus 300 of the present example embodiment, when the isolation portion 150 is formed as a trench, a color conversion layer for full color implementation and a partition therebetween may be formed similar to those of the micro light-emitting device display apparatus 10' of FIG. 6.

In the micro light-emitting device display apparatus 300 of the present example embodiment, for full color implementation, the partition may be formed in a trench region, and the color conversion layer may be formed in the opening region between the partitions. In order to realize full color of the micro light-emitting device display apparatus 300 according to the present example embodiment, the formation of the partitions and the color conversion layer in the opening region therebetween may be sufficiently inferred from FIG. 6, and thus the illustration of a modified example thereof is omitted.

Figure 9:
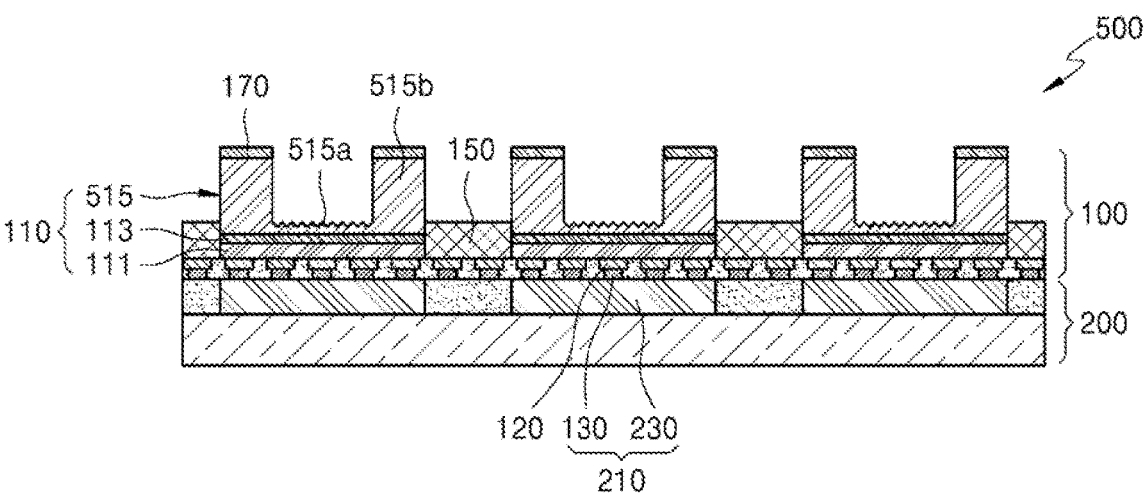
FIG. 9 is a schematic cross-sectional view of a micro light-emitting device display apparatus according to an example embodiment.

FIG. 9 is a schematic cross-sectional view of a micro light-emitting device display apparatus 500 according to another example embodiment. Compared with the micro light-emitting device display apparatuses 10, 10', and 300 according to the example embodiments described above with reference to FIG. 1 and FIGS. 6 to 7, the micro light-emitting device display apparatus 500 has a difference in that, instead of entirely thinning a second semiconductor layer 515, the second semiconductor layer 515 is patterned to have a first area 515a for forming an opening area and a partition 515b protruding around the first area 515a, and the second electrode 170 is formed on the partition 515b of the second semiconductor layer 515. The first area 515a of the second semiconductor layer 515 may correspond to the thinned second semiconductor layer 115 of FIG. 1, and the partition 515b of the second semiconductor layer 515 may correspond to the second semiconductor layer 115' of FIGS. 4A and 4B that is relatively thick before the thinning. The first area 515a of the second semiconductor layer 515 may correspond to the opening region.

The surface of first area 515a of the second semiconductor layer 515 may be roughened to increase extraction efficiency. A process of roughening the surface of the first area 515a of the second semiconductor layer 515 may be omitted. FIG. 9 shows an example in which the surface of the first area 515a of the second semiconductor layer 515 is roughened.

Figure 10:
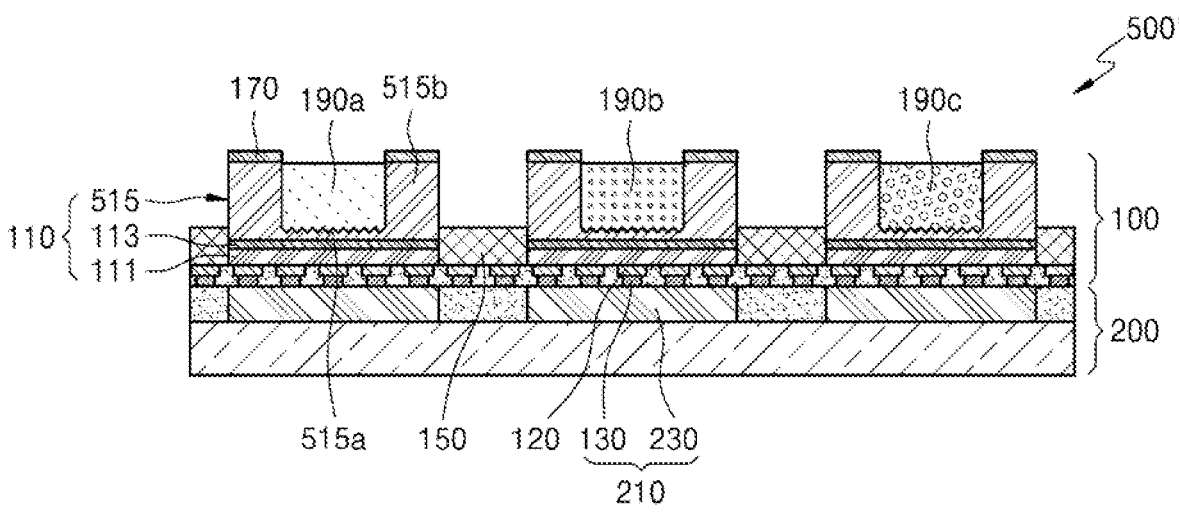
FIG. 10 is a schematic cross-sectional view of a micro light-emitting device display apparatus according to an example embodiment.

FIG. 10 is a schematic cross-sectional view of a micro light-emitting device display apparatus 500' according to another example embodiment. Comparing with the micro light-emitting device display apparatus 500 of FIG. 9, the micro light-emitting device display apparatus 500' has a difference in that the color conversion layers 190*a*, 190*b*, and 190*c* as in FIG. 6 are further included on the micro light-emitting devices 105.

Referring to FIG. 10, for full color implementation of the micro light-emitting device display apparatus 500' according to an example embodiment, the color conversion layers 190*a*, 190*b*, and 190*c* may be formed in the opening region between the partitions 170 of the second semiconductor layer 115. The color conversion layers 190*a*, 190*b*, and 190*c* forming one pixel may include, for example, the first color conversion layer 190*a* for converting the light emitted by the micro light-emitting device 105 to first color light, the second color conversion layer 190*b* for converting the light emitted by the micro light-emitting device 105 to second color light, and the third color conversion layer 190*c* for converting the light emitted by the micro light-emitting device 105 to third color light. For example, the first color light may be red light, the second color light may be green light, and the third color light may be blue light. When the micro light-emitting device 105 is provided to emit blue light, the first color conversion layer 190*a* may be provided to convert the blue light to red light, the second color conversion layer 190*b* may be provided to convert the blue light to green light, and the third color conversion layer 190*c* may be provided to convert the blue light generated from the micro light-emitting device 105 to blue light having a narrower bandwidth. A transparent layer for transmitting blue light may be provided instead of the third color conversion layer 190*c*. The number, arrangement, and the like of the color conversion layers 190*a*, 190*b*, and 190*c* forming one pixel may be changed according to a full color implementation method.

According to the micro light-emitting device display apparatus 500' according to an example embodiment described above with reference to FIGS. 9 and 10, the isolation portion 150 that pixelates the micro light-emitting devices 105 may be formed as, for example, a high resistance region, and the partition 515*b* that forms the color conversion layers 190*a*, 190*b*, and 190*c* may be formed in a region other than the opening region of the second semiconductor layer 515. The isolation portion 150 that pixelates the micro light-emitting devices 105 may be formed of a trench formed to the level of the first semiconductor layer 111, similarly to FIG. 7.

According to the micro light-emitting device display apparatuses 10, 10', 300, 500, and 500' according to the above-described example embodiments, by forming the bonding structure 210 including the plurality of bonding pads 230 arranged apart from each other and the dot pad array 130 provided to cover the bonding pads 230, on the coupling surfaces, facing each other, of the display unit 100 and the driving unit backplane 200, during coupling of the display unit 100 and the driving unit backplane 200, the plurality of dot pads 130 are bonded to each bonding pad 230, and thus, alignment-free bonding is possible.

As the display unit 100 and the driving unit backplane 200 are bonded using the bonding structure 210, there is no need to cut out the bonding pad by forming a hole in the upper portion after the alignment-free bonding. In other words, a mesa-free structure is possible.

As such, as the micro light-emitting device display apparatuses 10, 10', 300, 500, and 500' according to the example embodiments have the bonding structure 210 in which the bonding pads 230 correspond to the plurality of dot pads 130, during the coupling of the display unit 100 and the driving unit backplane 200, alignment-free bonding is possible, and thus, the alignment difficulty of the bonding pads 230 and bonding surface processing level may be lowered so that yield may be increased.

The micro light-emitting device display apparatuses 10, 10', 300, 500, and 500' according to example embodiments may be used in various electronic apparatuses. For example, the micro light-emitting device display apparatuses 10, 10', 300, 500, and 500' according to the embodiments may be usefully applied to augmented reality (AR) and/or virtual reality (VR) displays having a glasses or head-mounted structure needing a high pixels per inch (PPI), or apparatuses including the same. The disclosure is not limited thereto, and may be used for lens type apparatuses and the like, or for general micro light-emitting device display apparatuses and the like.

Figure 11:
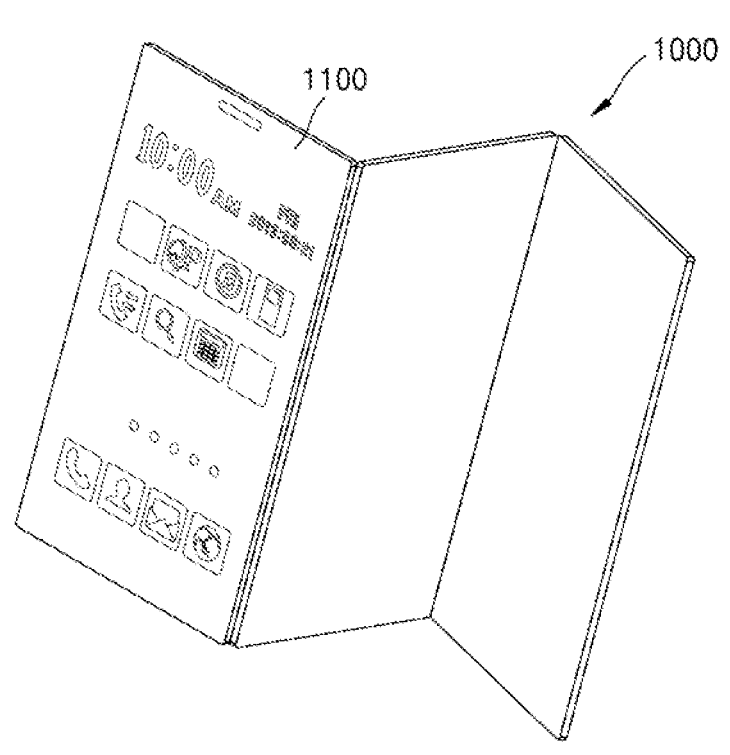
FIG. 11 illustrates an example of a mobile device employing a micro light-emitting device display apparatus according to an example embodiment.

FIG. 11 illustrates an example of a mobile device 1000 employing at least one of the micro light-emitting device display apparatuses 10, 10', 300, 500, and 500' according to example embodiments. The mobile device 1000 may include a display apparatus 1100. The display apparatus 1100 may include at least one of the micro light-emitting device display apparatuses 10, 10', 300, 500, and 500' according to example embodiments described with reference to FIGS. 1 to 10. The display apparatus 1100 may have a foldable structure, and may include, for example, a multi-fold display. Although the mobile device 1000 is illustrated as including a foldable display, this is merely an example, and the mobile device 1000 may include a flat display.

Figure 12:
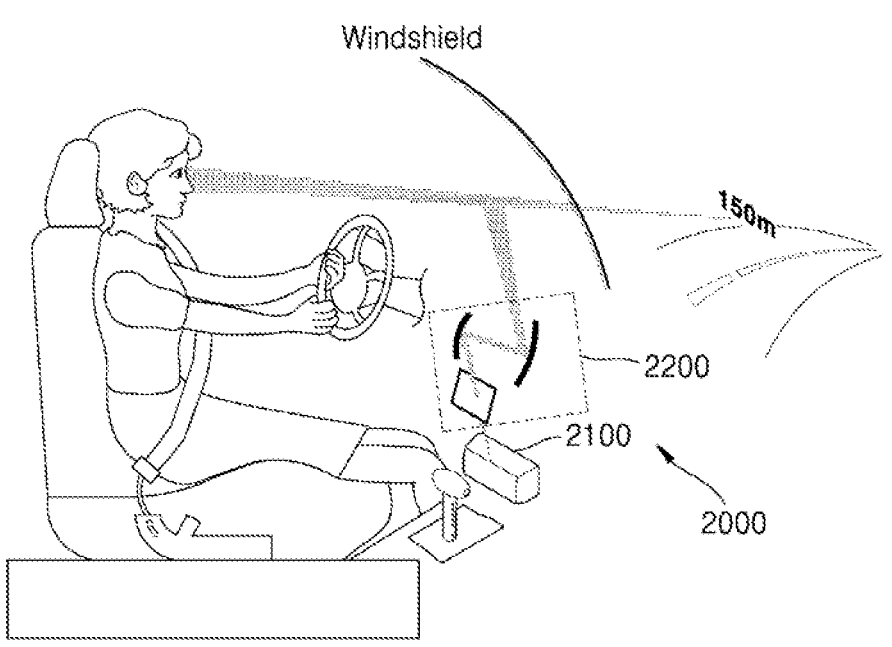
FIG. 12 illustrates an example of a vehicle employing a micro light-emitting device display apparatus according to an example embodiment.

FIG. 12 illustrates an example of a vehicle employing at least one of the micro light-emitting device display apparatuses 10, 10', 300, 500, and 500' according to example embodiments. The micro light-emitting device display apparatus 10, 10', 300, 500, or 500' according to an example embodiment may be applied to head-up display apparatuses for vehicles. A head-up display apparatus 2000 may include a display apparatus 2100 provided in an area of a vehicle, and at least one optical path change member 2200 for changing a path of light generated from the display apparatus 2100 so as to be seen by a driver.

Figure 13:
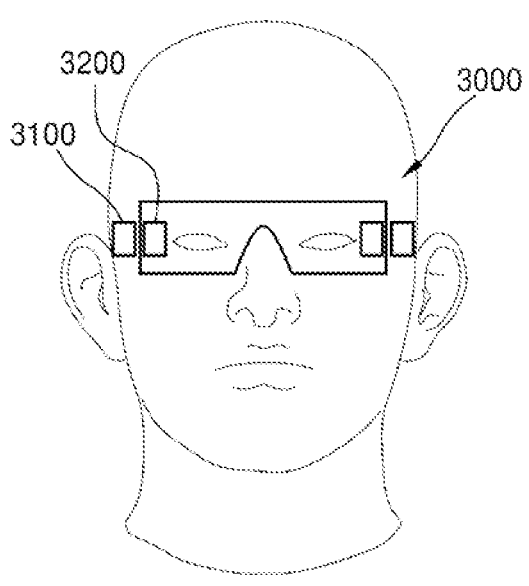
FIG. 13 illustrates an example of augmented reality glasses or virtual reality glasses employing a micro light-emitting device display apparatus according to an example embodiment.

FIG. 13 illustrates an example of AR glasses 3000 (or VR glasses) employing at least one of the micro light-emitting device display apparatuses 10, 10', 300, 500, and 500' according to example embodiments. The AR glasses 3000 may include a projection system 3100 for forming an image, and at least one element 3200 for guiding the image from the projection system 3100 to the eye of a user. The projection system 3100 may include at least one of the micro light-emitting device display apparatuses 10, 10', 300, 500, and 500' according to example embodiments.

Figure 14:
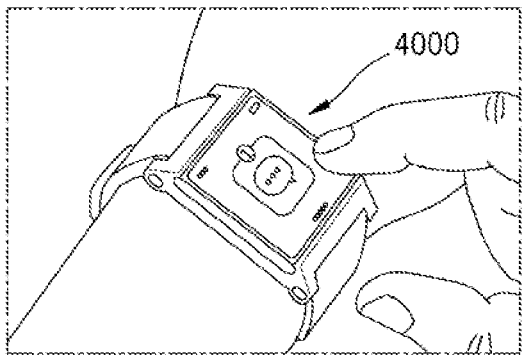
FIG. 14 illustrates an example of a wearable display employing a micro light-emitting device display apparatus according to an example embodiment.

FIG. 14 illustrates an example of a wearable display 4000 employing at least one of the micro light-emitting device display apparatus 10, 10', 300, 500, or 500' according to an example embodiment. The wearable display 4000 may include at least one of the micro light-emitting device display apparatus 10, 10', 300, 500, or 500' according to an example embodiment.

The micro light-emitting device display apparatuses 10, 10', 300, 500, and 500' according to example embodiments may be applied to μLED TVs, mobile displays, smart watches, AR glasses, VR glasses, head-up displays, signages, and the like. Besides the above, the micro light-emitting device display apparatuses 10, 10', 300, 500, and 500' according to example embodiments may be applied to various apparatuses needing a high PPI, such as rollable TVs, stretchable displays, and the like.

According to an example embodiment of a micro light-emitting device display apparatus and a method of manufacturing the same, during coupling of a display unit and a driving unit backplane, alignment-free bonding is possible, the alignment difficulty of a bonding pad and bonding surface processing level may be lowered, and thus, yield may be increased.

It should be understood that example embodiments described herein should be considered in a descriptive sense only and not for purposes of limitation. Descriptions of features or aspects within each embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A micro light-emitting device display apparatus comprising:

a display unit comprising a plurality of micro light-emitting devices arranged in an array;

a driving unit backplane comprising a plurality of driving devices configured to drive the display unit; and a bonding structure provided on a first coupling surface of the driving unit backplane and a second coupling surface of the display unit facing the first coupling surface, the bonding structure electrically connecting the plurality of micro light-emitting devices of the display unit to the plurality of driving devices of the driving unit backplane, wherein the bonding structure comprises:

a plurality of bonding pads spaced apart from each other on one of the first coupling surface and the second coupling surface; and a dot pad array provided on the other one of the first coupling surface and the second coupling surface, the dot pad array being arranged in a two-dimensional array to cover the plurality of bonding pads and an area between the plurality of bonding pads, so that a plurality of dot pads of the dot pad array corresponds to each bonding pad of the plurality of bonding pads, wherein each of the plurality of micro light-emitting devices comprises:

a first semiconductor layer of a first conductive type adjacent to the bonding structure;

an active layer on the first semiconductor layer;

a second semiconductor layer of a second conductive type formed on the active layer, the second conductive type being opposite to the first conductive type; and an electrode electrically connected to the second semiconductor layer, wherein each of the plurality of micro light-emitting devices further comprises a first electrode between the first semiconductor layer and the plurality of dot pads.

2. The micro light-emitting device display apparatus of claim 1, wherein the display unit further comprises an isolation portion configured to pixelate the plurality of micro light-emitting devices.

3. The micro light-emitting device display apparatus of claim 2, wherein the isolation portion is formed by ion implantation.

4. The micro light-emitting device display apparatus of claim 2, wherein the isolation portion is formed down to the bonding structure to pixelate the plurality of micro light-emitting devices.

5. The micro light-emitting device display apparatus of claim 1, wherein the display unit further comprises a trench configured to pixelate the plurality of micro light-emitting devices.

6. The micro light-emitting device display apparatus of claim 1, wherein the dot pad array is provided on the second coupling surface, and wherein the first electrode forms a stack structure with at least one dot pad of the dot pad array.

7. The micro light-emitting device display apparatus of claim 6, wherein the first electrode comprises a plurality of dot electrodes corresponding to the dot pad array and arranged in a two-dimensional array, and wherein each dot pad of the dot pad array forms the stack structure with a corresponding dot electrode of the plurality of dot electrodes.

8. The micro light-emitting device display apparatus of claim 7, wherein each dot pad has a size less than a size of each dot electrode.

9. The micro light-emitting device display apparatus of claim 1, wherein the second semiconductor layer is formed to have a roughened surface.

10. The micro light-emitting device display apparatus of claim 1, wherein each of the plurality of micro light-emitting devices is configured to generate blue light and, further comprising a color conversion layer on at least some of the plurality of micro light-emitting devices.

11. An electronic apparatus comprising the micro light-emitting device display apparatus of claim 1.

12. The micro light-emitting device of claim 1, where the first coupling surface on the driving unit backplane is separate from the second coupling surface on the display unit to allow alignment-free bonding of the driving unit backplane with the display unit.

13. The micro light-emitting device of claim 12, wherein the first coupling surface is formed with the dot pad array before connection with the second coupling surface, and the second coupling surface is formed with the conductive pads before connection with the first coupling surface.

14. The micro light-emitting device of claim 12, wherein the first coupling surface is formed with the conductive pads before connection with the second coupling surface, and the second coupling surface is formed with the dot array pad before connection with the first coupling surface.

* * * * *